United States Patent
Menge

(10) Patent No.: US 8,324,583 B2
(45) Date of Patent: Dec. 4, 2012

(54) SCINTILLATION PIXEL DESIGN AND METHOD OF OPERATION

(75) Inventor: Peter R. Menge, Chagrin Falls, OH (US)

(73) Assignee: Saint-Gobain Ceramics & Plastics, Inc., Worcester, MA (US)

( * ) Notice: Subject to any disclaimer, the term of this patent is extended or adjusted under 35 U.S.C. 154(b) by 98 days.

(21) Appl. No.: 12/944,452

(22) Filed: Nov. 11, 2010

(65) Prior Publication Data

US 2011/0108733 A1 May 12, 2011

Related U.S. Application Data

(60) Provisional application No. 61/260,689, filed on Nov. 12, 2009.

(51) Int. Cl.
*H01L 27/146* (2006.01)

(52) U.S. Cl. ................................................. 250/370.08

(58) Field of Classification Search ............ 250/370.01–370.15, 483.1; 378/98.8
See application file for complete search history.

(56) References Cited

U.S. PATENT DOCUMENTS

| | | | | |
|---|---|---|---|---|
| 5,763,887 A | * | 6/1998 | Murphy | 250/366 |
| 6,031,234 A | * | 2/2000 | Albagli et al. | 250/370.11 |
| 6,516,044 B1 | * | 2/2003 | Lyons | 378/19 |
| 7,372,045 B2 | * | 5/2008 | Kondo et al. | 250/483.1 |
| 7,531,817 B2 | * | 5/2009 | Nagata et al. | 250/483.1 |

FOREIGN PATENT DOCUMENTS

| | | |
|---|---|---|
| JP | 2002062358 | 2/2002 |
| JP | 2007248266 | 9/2007 |
| WO | 0151951 A1 | 7/2001 |
| WO | 2007060813 | 5/2007 |

OTHER PUBLICATIONS

International Search Report, dated Jul. 1, 2011, received in international patent application no. PCT/US2010/56376, 3 pgs.

\* cited by examiner

*Primary Examiner* — Kiho Kim

(74) *Attorney, Agent, or Firm* — Abel Law Group, LLP; Robert T. Conway

(57) ABSTRACT

Scintillation pixels are described that can include a series of ridges formed in the outer surfaces of the pixels. The ridges may be oriented vertically or horizontally and can result in faster scintillators and in scintillators that exhibit a reduction in light spread.

20 Claims, 11 Drawing Sheets

| 0 | 0 | 0 | 0 | 0 | 0 | 0 | 0 |
|---|---|---|---|---|---|---|---|
| 0 | 0 | 0 | 0 | 0.1 | 0 | 0 | 0 |
| 0 | 0 | 0.1 | 0.5 | 0.4 | 0.1 | 0 | 0 |
| 0 | 0 | 0.5 | 23.9 | 23.8 | 0.5 | 0.1 | 0 |
| 0 | 0 | 0.5 | 23.7 | 23.4 | 0.5 | 0 | 0 |
| 0 | 0 | 0.1 | 0.5 | 0.5 | 0.1 | 0 | 0 |
| 0 | 0 | 0 | 0 | 0 | 0 | 0 | 0 |
| 0 | 0 | 0 | 0 | 0 | 0 | 0 | 0 |

FIG. 8A

| 0.1 | 0.1 | 0.1 | 0.1 | 0.1 | 0.1 | 0.1 | 0.1 |
|---|---|---|---|---|---|---|---|
| 0.1 | 0.1 | 0.2 | 0.3 | 0.4 | 0.2 | 0.1 | 0.1 |
| 0.1 | 0.2 | 0.6 | 1.3 | 1.4 | 0.7 | 0.3 | 0.1 |
| 0.1 | 0.4 | 1.2 | 19.5 | 19.8 | 1.2 | 0.4 | 0.1 |
| 0.1 | 0.4 | 1.3 | 19.8 | 19.9 | 1.3 | 0.4 | 0.1 |
| 0.1 | 0.3 | 0.7 | 1.2 | 1.3 | 0.6 | 0.2 | 0.1 |
| 0.1 | 0.1 | 0.3 | 0.3 | 0.4 | 0.2 | 0.2 | 0.1 |
| 0.1 | 0.1 | 0.1 | 0.1 | 0.1 | 0.1 | 0.1 | 0.1 |

FIG. 8B

SCINTILLATION PIXEL DESIGN AND METHOD OF OPERATION

RELATED APPLICATION

This application claims the benefit of U.S. Provisional Patent Application Ser. No. 61/260,689 filed on Nov. 12, 2009. The disclosure of this application is fully incorporated herein by reference.

FIELD OF INVENTION

The disclosure relates to scintillators and, in particular, to scintillation pixels used in imaging devices.

BACKGROUND

Scintillation detectors are typically used to detect high energy emissions such as high energy photons, electrons or alpha particles that are not easily detected by conventional photodetectors. A scintillator, or scintillation pixel, absorbs high energy emissions and converts the energy to a light pulse. The light may be converted to electrons (i.e., an electron current) with a photodetector such as a photodiode, charge coupled detector (CCD) or photomultiplier tube. Scintillation detectors may be used in various industries and applications including medical (e.g., to produce images of internal organs), geophysical (e.g., to measure radioactivity of the earth), inspection (e.g., non-destructive, non-invasive testing), research (e.g., to measure the energy of photons and particles), and health physics (e.g., to monitor radiation in the environment as it affects humans).

Many scanning instruments include scintillation detectors that comprise pixellated arrays of scintillation crystals (pixels). Arrays can consist of many scintillation pixels that can be arranged in rows and columns. Individual pixels are typically cuboid in shape and may be positioned parallel to each other and may be retained in position with an adhesive such as an epoxy. A scintillation pixel is typically positioned so that its axis of propagation is aligned with the high energy source and with the photo detector. The array may be positioned in an imaging device so that one end of the array (high energy end) receives excitatory energy and the opposed end (light emitting end) transmits resultant visible light to a photodetector. The depth of the array from the high energy end to the light emitting end is typically referred to as the x-ray depth. Light exiting the emitting exit end can be correlated to a specific scintillation event in a specific pixel, and this light can be used to construct a pattern of excitatory energy impacting the high energy end of the array.

SUMMARY

In one aspect a scintillation pixel is provided, the scintillation pixel comprising a scintillator element having at least one side, a high energy end and an opposed light emitting end, and wherein the at least one side of the scintillator element is substantially parallel to the axis of light propagation and defines a plurality of ridges each having a height of at least 1 μm.

In another aspect a scintillation pixel is provided, the scintillation pixel comprising a scintillator element having an axis of propagation and a substantially transparent film adjacent the scintillator element, the substantially transparent film having an exterior surface facing away from the scintillator element, wherein the exterior surface of the substantially transparent film includes a plurality of portions having surfaces that are non-parallel to the axis of propagation of the scintillator element.

In another aspect a method of fabricating a scintillation pixel is provided, the method comprising forming a series of ridges on a side of a scintillator element, the side being substantially parallel to the axis of light propagation of the scintillator element and affixing a substantially reflective material to the side of the scintillator element.

In another aspect a method of fabricating a scintillation pixel is provided, the method comprising associating a substantially transparent film with a scintillator element to position the film so that the majority of the exterior surface of the film is not parallel with the adjacent surface of the scintillator.

In another aspect an imaging device is provided, the imaging device comprising a source of high energy emission, a photodetector for detecting light, and a scintillation pixel comprising a scintillator element having at least one non-planar side that includes a series of ridges wherein each ridge has a height of at least 10 μm.

In another aspect an imaging device is provided, the imaging device comprising a source of high energy emission, a photodetector for detecting light, and a scintillation pixel comprising a scintillator element and a substantially transparent film surrounding at least a portion of the scintillator element wherein an exterior surface of the film includes a plurality of ridges and each ridge has a height of at least 10 μm.

In another aspect a method of concentrating the detectable light emission of a scintillation device is provided, the method comprising providing a scintillator element including a series of ridges on a surface of the scintillator element wherein the ridges are perpendicular to the axis of light propagation, exciting the scintillator element with a high energy emission to form one or more photons of detectable light, and detecting the detectable light with a photodetector.

In another aspect a method of concentrating the detectable light emission of a scintillation device is provided, the method comprising providing a scintillator element including a substantially transparent film surrounding at least a portion of the element wherein the film includes a plurality of surfaces exterior to the scintillator element that are not parallel to the axis of light propagation, exciting the scintillator element with a high energy emission to form one or more photons of detectable light, and detecting the detectable light with a photodetector.

The subject matter of this application may involve, in some cases, interrelated products, alternative solutions to a particular problem, and/or a plurality of different uses of a single system or article.

BRIEF DESCRIPTION OF THE DRAWINGS

FIGS. 8A and 8B provide grids representing the percentage of light contacting a photodetector when associated with an embodiment including horizontally oriented ridges in the pixel (8A) and in an embodiment having smooth, planar sides (8B);

DETAILED DESCRIPTION

Figure 1:
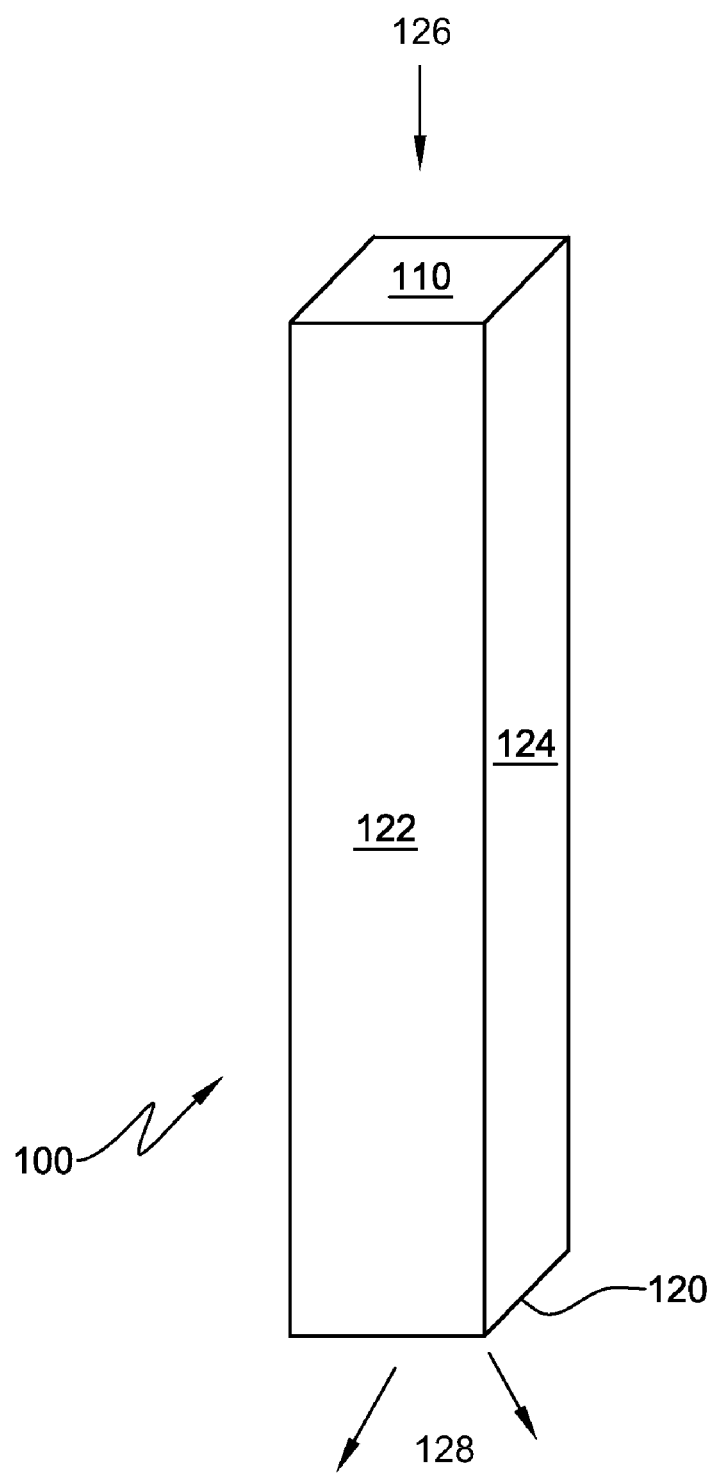
FIG. 1 provides a plan view of a scintillator element.

Scintillation detectors are generally used to detect relatively high energy photons, electrons or alpha particles, where high energy is 1 KeV or higher, including gamma rays, α-particles and B-particles. It may be appreciated that these photons, electrons or alpha particles may not be easily detected by conventional photodetectors, which may, for example, be sensitive to photons at wavelengths of 200 nm or greater, including 200 nm to 800 nm. A scintillator, or scintillation crystal, ceramic or plastic, absorbs excitatory waves or particles and converts the energy of the waves or particles to a light pulse. The term "scintillator" herein refers to a material that emits light ("scintillation light") in response to high energy photons, electrons or alpha particles wherein high energy is 1 KeV or higher ("excitatory energy"). The light may be converted to electrons (i.e., an electron current) with a photodetector such as a photodiode, charge coupled detector (CCD) or photomultiplier tube. As used herein, the term "high energy surface" or "high energy end" denotes the surface of a scintillator or pixel through which high energy photons, electrons or alpha particles typically first enter. A "scintillator element" is the material in which the scintillation event takes place and is typically a crystal, ceramic or plastic (polymer) scintillator. "Detectable light" is the light output by a scintillator that can be detected by a photodetector. Detectable light typically has a wavelength in the range of 200 to 800 nm and above. A "photodetector" converts detectable light emitted from a scintillation crystal into an electrical signal. The term "optically coupled" refers to at least one coupled element being adapted to impart light to another coupled element directly or indirectly. Known scintillators include materials such as ceramic, crystal and polymer scintillators. A "scintillation crystal" is a scintillator made primarily of inorganic crystal. "Scintillation pixels" are known to those of skill in the art and comprise individual scintillators that are each associated with one or more photodetectors. A scintillator pixel may include a scintillator element and a transparent film and/or a reflective material surrounding at least a portion of the scintillator element. Photodetectors are known to those of skill in the art and include, for example, charge-coupled devices (CCDs) and photomultiplier tubes (PMTS) such as position sensitive photomultiplier tubes (PSPMTs). The detectable light from each pixel can be independently detected. For instance a single PSPMT may be associated with the output from a single pixel in an array. The pixels may be separated from each other and may be joined via a common substrate. Multiple scintillation pixels can be associated together to form a "scintillation array."

Scintillation detectors may be used in various industries and applications including medical (e.g., to produce images of internal organs), geophysical (e.g., to measure radioactivity of the earth), inspection (e.g., non-destructive, non-invasive testing), research (e.g., to measure the energy of photons and particles), and health physics (e.g., to monitor waves or particles in the environment as it affects humans). Medical devices may include positron emission tomography (PET) scanners, gamma cameras, computed tomography (CT) scanners and radioimmunoassay applications. Geophysical devices may include well logging detectors. Inspection devices may include radiance detectors, such as thermal neutron activation analysis detectors, luggage scanners, thickness gauges, liquid level gauges, security and manifest verification (both active and passive devices), spectroscopy devices (radioisotope identification devices, both active and passive devices), and gross counters (both active and passive.) Research devices may include spectrometers and calorimeters. Health physics applications may include laundry monitoring and area monitoring.

As shown in FIG. 1 a scintillation pixel may be substantially cuboidal in shape and may include smooth, polished surfaces on six sides. In operation, excitatory energy 126 enters the pixel at high energy end 110 and the energy is converted to detectable light at a point within the pixel. At least some of the detectable light 128 exits from surface 120 and may impact a photodetector such as a PSPMT. The detectable light may not exit the pixel directly and may reflect off walls 122 and 124, for instance, numerous times before exiting the pixel. Therefore the detectable light may exit the scintillation pixel at various angles and at various times due to the different paths that the detectable light may travel between the time of scintillation and the time of exiting light emitting surface 120.

The axis of propagation, as used herein, refers to the axis that is parallel to the average pathway that light travels along from the high energy end of a scintillator to the light emitting surface of the scintillator. The axis of propagation is often parallel to the longitudinal axis of the scintillator. Detectable light does not typically exit a scintillator at a single, fixed angle that is aligned with the axis of propagation. Instead, light may exit the scintillator at a variety of angles so that the light roughly forms a cone that spreads outwardly as it moves away from the light emitting surface of the scintillator. As a result, the detectable light flux decreases as distance from the scintillation pixel increases, and the intensity of the detectable light is spread across a greater area at the surface of the photodetector which can result in a reduction in spatial resolution.

As described herein, a scintillation pixel can be constructed to interact with a photon of detectable light so that the photon's path is altered from its normal pathway. This pathway alteration can result in, for example, faster scintillators and narrower cones of detectable light impacting associated photodetectors. These improvements can be achieved by altering the structure of a scintillation pixel rather than by changing the composition of the scintillator. A scintillation pixel may include areas around the scintillation element where the interface between adjoining materials is not parallel to the axis of propagation. For instance, a pixel may include ridges, such as prism shaped ridges, on the longitudinal sides (not the excitation end or the light emitting end) of the pixel. The ridges can form gaps in spaces between the ridges. Ridges, and their associated gaps, may alter the path of a detectable photon by altering the angle that the photon takes when interacting with the interface between the sides of the scintillator and an adjacent reflective material. For instance, ridges can result in alterations in refraction that, overall, shorten the path length of the photon from the point of scintillation to the photodetector. Simulation results show that horizontally arranged prism shaped ridges on the exterior surface of a scintillation pixel can improve the intensity of the image by narrowing the amount of light spreading that occurs after detectable light exits the scintillator. For example, the average exiting angle of a photon may be reduced by more than 5 degrees, more than 10 degrees or more than 12 degrees. Simulation results also confirm that vertically oriented prism ridges result in a shorter light path and a reduction in rise time jitter. The prism shaped ridges may be arranged so that a plurality of ridges are parallel to each other. The ridges may be, for example, horizontal (perpendicular) or vertical (parallel) with respect to the pixel's axis of propagation. The ridges may be integral to the pixel (e.g., molded or machined) or may be of a separate material that is attached or otherwise associated with the external surface of the pixel. This material may be the same as, or different than, the material that the pixel is made of and need not be a scintillator material. For instance, the sides of the pixel may be covered, or partially covered, with a micro-prism film such as Vikuiti™ TRAF. In this case, the side surfaces of the scintillator element itself may be smooth but the ridges of the micro-prism film can provide light altering effects similar to those achieved when the ridges are integral to the scintillator element itself. As used herein, a "film" is a material that includes a surface, or layer, positioned exterior to the scintillator element that can alter the refractive index of detectable photons exiting the scintillator element when compared to a smooth surfaced scintillator element surrounded by a smooth surfaced reflector. The alteration in refractive index can be a result of a gap, or series of gaps, between the film and a surrounding reflective material. There may also be a gap, or series of gaps, between the film and the scintillator element. The scintillator element and the film may be optically coupled by filling this gap or gaps with a material, such as an adhesive, having a refractive index of greater than 1.0. The film may be thin or thick and may have features (e.g., folds or ridges) formed on one or more surfaces of the film. For instance, a film may include features on its surface that is exterior to the scintillator element but may be smooth on the surface that faces the scintillator element.

A scintillator pixel may be surrounded or partially surrounded by a diffuse or specular reflector. Examples of diffuse reflectors include, for example, PTFE and polyester films. If the scintillator element includes integral ridges, then the reflector may be planar. For instance, if the sides of the scintillator element include a series of equilateral prism shaped ridges (60° at each corner) and if the ridges are perpendicular to the axis of light propagation, then an adjacent reflective material that is parallel to the axis of light propagation will form a 60° angle with each exposed surface of the integral prism shaped ridge. In other embodiments with planar, smooth sided scintillators, the surrounding material itself may include the ridges, such as with a transparent micro-prism film. In still other embodiments, both the scintillator and the surrounding transparent film may include ridges or be non-planar. This can result in a change in refractive index that can, in some cases, cause reflection of a photon before it passes through to a surrounding reflective material. In many embodiments, at least a portion of the outer surface of the scintillator element is non-parallel to at least a portion of a reflector that surrounds it. In some cases, no portion of the outer surface of the scintillator is parallel to, or in the same plane as, the reflector that surrounds it. This is in contrast to known scintillation pixels in which a reflective material is directly adjacent to the scintillator element and where the surface of the reflector material is parallel to the surface of the scintillator element.

The embodiments described herein may be applicable to a variety of scintillators including those composed of crystals, ceramics and plastics. Appropriate crystals and ceramics may include any one or more of, for example, cesium iodide (CsI), thallium doped cesium iodide (CsI(Tl)), bismuth germanate (BGO), thallium doped sodium iodide (NaI(Tl)), barium fluoride ($BaF_2$), europium doped calcium fluoride ($CaF_2$ (Eu)), cadmium tungstate ($CdWO_4$), lead tungstate ($PbWO_4$), zinc tungstate ($ZnWO_4$), lutetium oxyorthosilicate ($Lu_2SiO_5$), lanthanum bromide ($LaBr_3(Ce)$), lutetium iodide ($LuI_3$), cerium doped lanthanum chloride ($LaCl_3(Ce)$), cerium doped lutetium yttria silicates ($LuYSiO_5(Ce)$ (LYSO)), silver doped zinc sulfide (ZnS(ag)) yttrium aluminum garnet ($Y_3Al_5O_{12}(Ce)$), terbium-doped gadolinium oxysulfide (GOS(Tb)), europium doped lutetium oxide ($Lu_2O_3(Eu)$), or cerium doped cesium lithium yttrium chloride elpasolite ($Cs_2LiYCl_6(Ce)$ (CLYC)). Crystals may be polycrystalline or single crystal in nature. Examples of organic scintillators may include polyvinyltoluene (PVT) with organic fluors present in the PVT, as well as other polymer materials.

Some embodiments that provide shorter light paths may be applied, in particular, to fast scintillators such as, for example, lanthanum bromide, LYSO and fast plastic scintillators. The incident face of the pixels may be of any appropriate shape including square, circular or polygonal. The pixels can include any number of sides and may be cuboid in shape and sized in the x, y and z (x-ray depth) dimensions to match the requirements of the device with which the pixel or pixel array is used.

Figure 2:
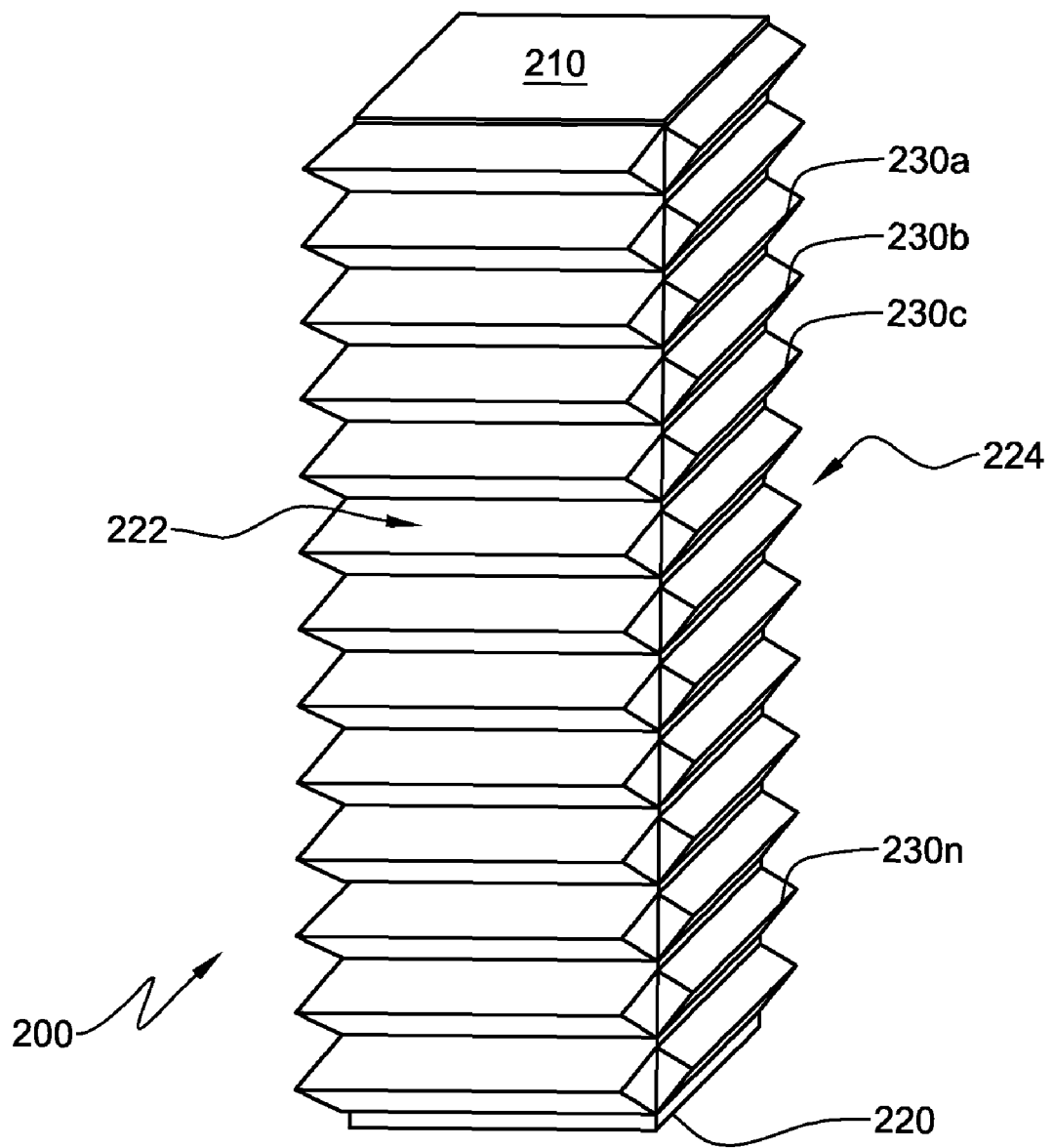
FIG. 2 provides a plan view of an embodiment of a scintillator element including horizontal prism shaped ridges.

FIG. 2 provides a schematic illustration of a pixel that includes a series of horizontally arranged parallel prism shaped ridges 230a-230n on the surface of a scintillation pixel. For clarity purposes, the ridges are shown much larger in relation to the pixel than would typically be applied. From valley to peak, a ridge may have a height of, for example, 35 μm. Although it may be preferred that the ridges comprise planar surfaces, there are some embodiments in which the ridges may be curved or non-planar. For instance, in cross section the ridges may appear as a series of "waves" rather than a series of triangles. The height of a wave shaped ridge can also be determined by measuring from trough to peak. A single scintillation pixel may include hundreds or thousands of parallel ridges at a frequency of, for example, 200 ridges per cm of pixel. Ridges may be formed independently on each surface of the pixel as shown or may run continuously around the perimeter of the pixel. Ridges may be regularly or irregularly spaced from each other. In some embodiments ridges may be a fixed distance from each other, such as, for example, 50, 80 or 100 microns. In other embodiments, the distance between ridges can vary over a portion of the scintillator or over the entirety of the scintillator. In one embodiment, a ridge is formed in a pixel as a continuous thread that winds its way continuously around the pixel from one end to the other. This embodiment is still considered to have a "series of ridges." If a transparent film is used to provide ridges, the dimensions of ridges formed in the film may be similar to those that can be formed on the scintillator element.

After excitatory energy enters scintillator 200 through high energy surface 210 it either passes entirely through the scintillator or produces a scintillation event in the pixel. The scintillation event results in the formation of detectable light that starts in a random direction from the scintillation point. Light that is not directed vertically can strike one of the ridged surfaces of the pixel, causing the photon to travel an altered path. The photon may be reflected by an adjacent reflective surface, and can exit the light emitting surface of the scintillation pixel at an angle that is more closely aligned with the axis of propagation. Not all pixels are necessarily affected in this manner. As a result of the altered path, the average spread of the light emission can be narrowed as it exits the pixel.

Figure 3:
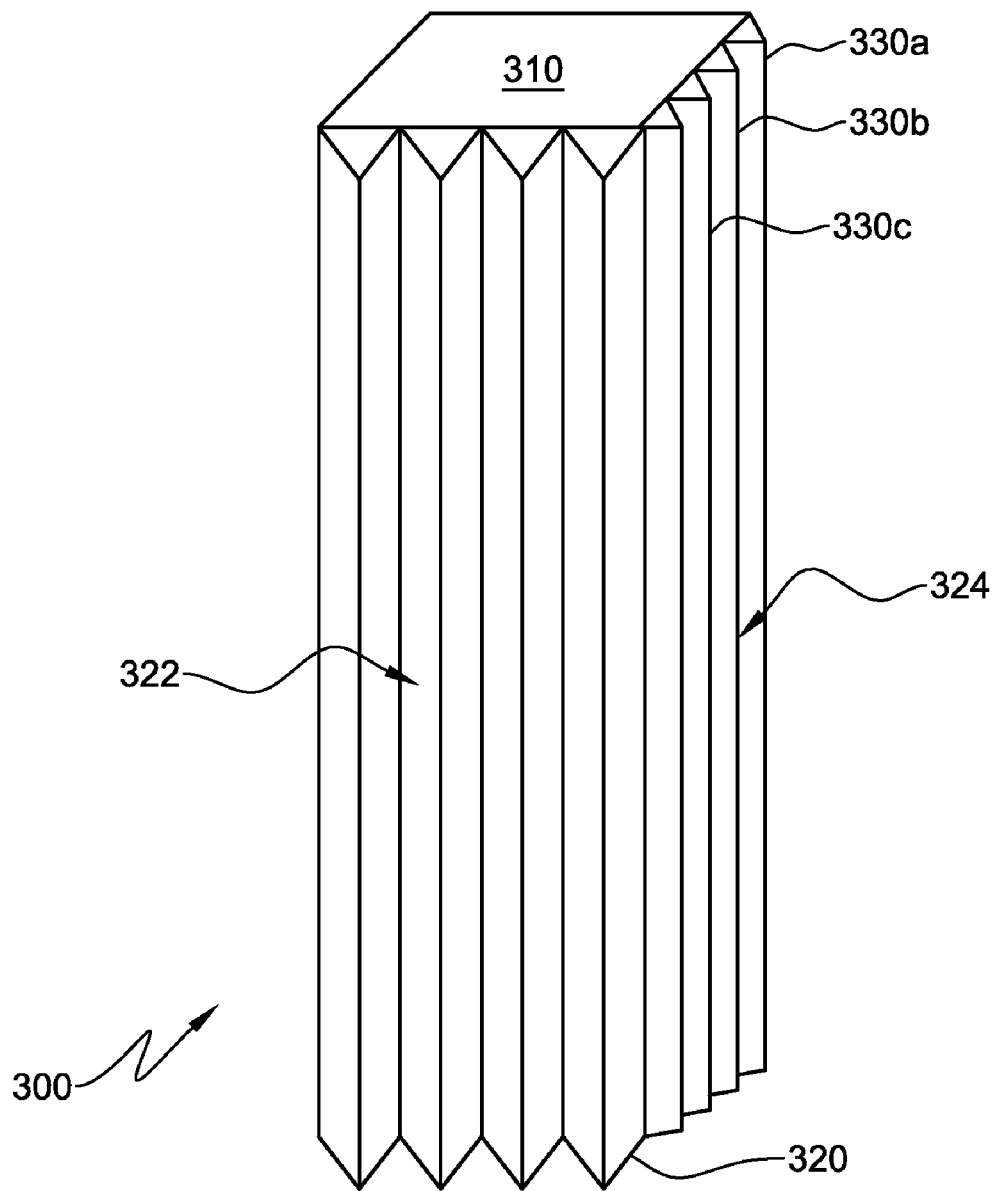
FIG. 3 provides a plan view of an embodiment of a scintillator element including vertically oriented prism shaped ridges.

FIG. 3 provides a schematic illustration of a scintillation pixel in which prism shaped ridges are arranged vertically on the exterior of the four longitudinal surfaces of the pixel. This means that the ridges are substantially parallel to the axis of propagation of the pixel. As in FIG. 2, the dimensions of the ridges in the illustration have been exaggerated in relation to the scintillation pixel itself. The ridges may cover all sides of the pixel and may extend from one end of the scintillation pixel to the other. In other embodiments however the ridges may extend over only a portion of the pixel surface.

Figure 4:
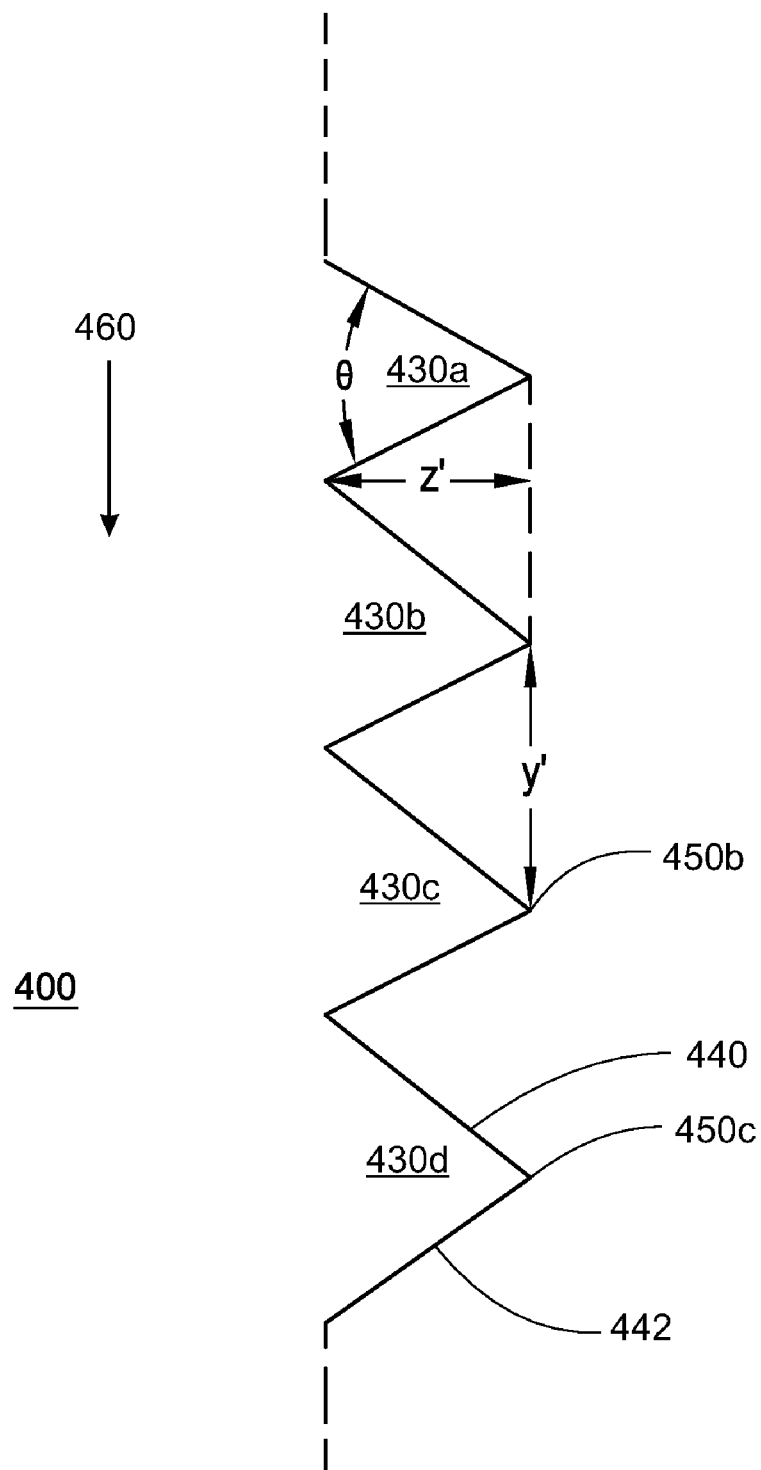
FIG. 4 provides an enlarged cross-sectional view of an embodiment of a scintillation pixel that includes a series of prism shaped ridges.

FIG. 4 provides an enlarged cross-sectional illustration of an edge portion of an embodiment of a scintillation pixel including prism shaped ridges 430a, 430b, 430c, 430d, etc. Arrow 460 indicates the axis of propagation of scintillator element 400. Each of the exposed ridge surfaces such as surfaces 440 and 442 can be planar or substantially planar. Each of the ridge peaks (e.g., 450b and 450c) preferably comes to an apex that is pointed and sharply defined, however, in practice these ridges may be at least partially rounded due to, for example, limitations of materials and ease of manufacturing techniques. The ridge height z' is defined as the distance from the valley between two ridges to the imaginary line that connects two adjoining ridge peaks, as shown. The ridge width may be defined as the distance y' between two adjacent ridge peaks. The shape of each ridge can also be defined by ridge peak angle $\theta$. As a prism shaped ridge gets sharper and steeper, $\theta$ decreases. Similarly, as the ratio of z' to y' gets larger, $\theta$ decreases and the steepness of the ridge increases. Values for $\theta$ and z' and y' can vary depending on, for example, pixel composition, pixel dimensions, photodetector type, photodetector dimensions, and the type and geometry of the instrument with which the scintillation pixel is to be used. In some embodiments, the size of ridge peak angle $\theta$ is within a range of from 30 to 150 degrees, 30 to 90 degrees or 40 to 80 degrees. In one embodiment the prism forms an equilateral triangle with 60 degree angles at every corner. In many embodiments, ridge peak angle $\theta$ is consistent among the adjacent ridges on a pixel. In other embodiments, however, the ridge peak angle may vary among ridges along the length (or width) of the scintillation pixel. Ridge height z' may be greater than 1 um, greater than 10 um, greater than 100 um or greater than 1 mm. Ranges for ridge height z' may be, for example, 1-10 um, 1-100 um, 1-1000 um, or greater. In simulated evaluations it has been found that a ridge height z' of 70 $\mu$m in a $LaBr_3$ pixel, in an equilateral triangle configuration, provides good results when oriented either vertically or horizontally. Ridge width y' may be of similar or identical dimensions to that of ridge height z'. Thus, in some embodiments ridge width y' may be, for example, 1-10 um, 1-100 um, 1-1000 um, or greater. A single scintillator element may have more than 100, more than 1000 or more than 10,000 ridges and ridges may be present at more than 10, more than 100 or more than 1000 ridges per cm of pixel length.

Figures 5A, 5B:
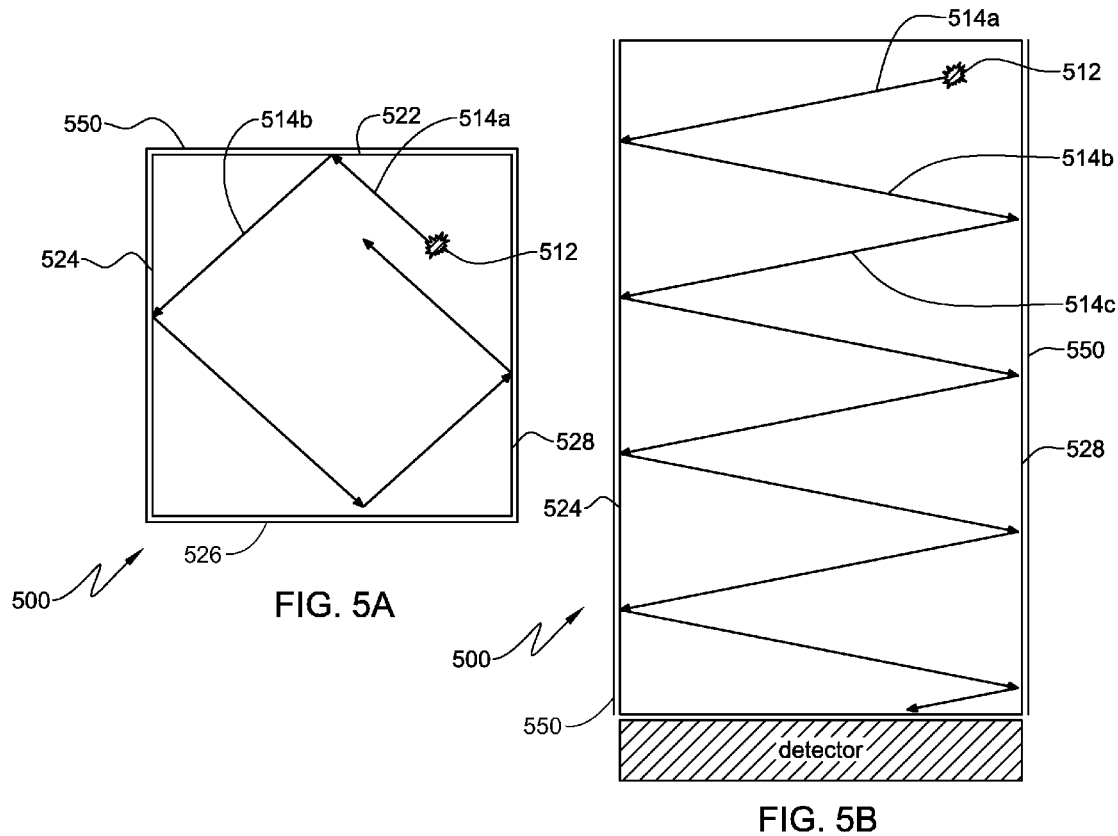
FIGS. 5A and 5B provide top and side schematic views of a photon pathway in a scintillation pixel.

FIGS. 5A and 5B provide top and side views, respectively, illustrating how a detectable photon travels through a scintillation pixel having flat, polished sides 522, 524, 526 and 528 and diffuse reflector 550 that surrounds the polished sides. A high energy emission interacts with the scintillator at scintillation point 512 to produce a scintillation event and one or more photons of detectable light. Photons are emitted from scintillation point 512 in random directions and the path of one such photon is illustrated in path 514, including 514a, 514b and 514c. The top view provided in FIG. 5A illustrates the lateral pathway of the photon as it bounces from wall to wall inside the polished electrode 500. The vertical motion of the same photon is illustrated in the schematic shown in FIG. 5B, and in the case shown, the photon path interacts with a wall of the scintillation pixel at least 8 times before impacting the detector, resulting in a delay in detection of the emitted photon.

Figures 6A, 6B:
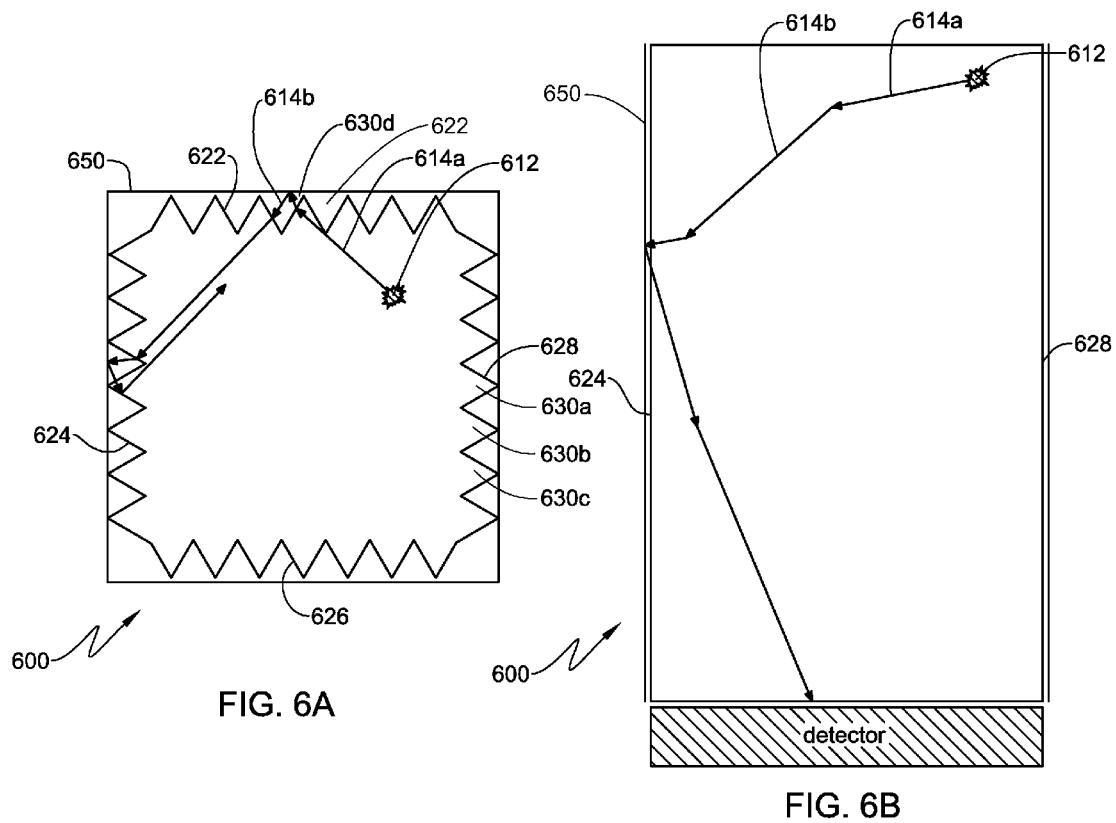
FIGS. 6A and 6B provide top and side schematic views, respectively, showing a photon pathway in one embodiment of a scintillation pixel that includes vertically oriented prism shaped ridges.

FIGS. 6A and 6B provide top and side views, respectively, of a scintillation pixel 600 including longitudinal prism shaped ridges 630a, 630b, 630c . . . 630n. For purposes of clarity, the ridges are not illustrated in the side view of FIG. 6B. After a high energy emission interacts with the scintillator pixel at point 612 to produce a scintillation event, photons are emitted in random directions and a path of one photon of detectable light is illustrated as path 614 (614a to 614b, etc.). As can be seen in the top view of FIG. 6A and the side view of FIG. 6B, when the photon interacts with the prism shaped ridge 630d and diffuse reflector 650, the pathway of the photon is altered so that the photon travels more directly to the detection end of the scintillator crystal. The number of interactions with side walls 622, 624, 626 and 628 of the scintillation pixel is significantly reduced from about 8 (FIGS. 5A and 5B) to about 4. As a result, the photon exits the scintillator more quickly, resulting in a faster scintillator and reduced rise time jitter. Of course not every photon travels this same pathway but, on average, a photon will encounter fewer interactions with side walls and faster exit from the scintillator when prism shaped ridges are used. These faster configurations may be particularly advantageous when used in applications benefiting from improved coincidence timing, such as PET scanners, columnated radiography and when associated with time of flight algorithms.

Figures 7A, 7B:
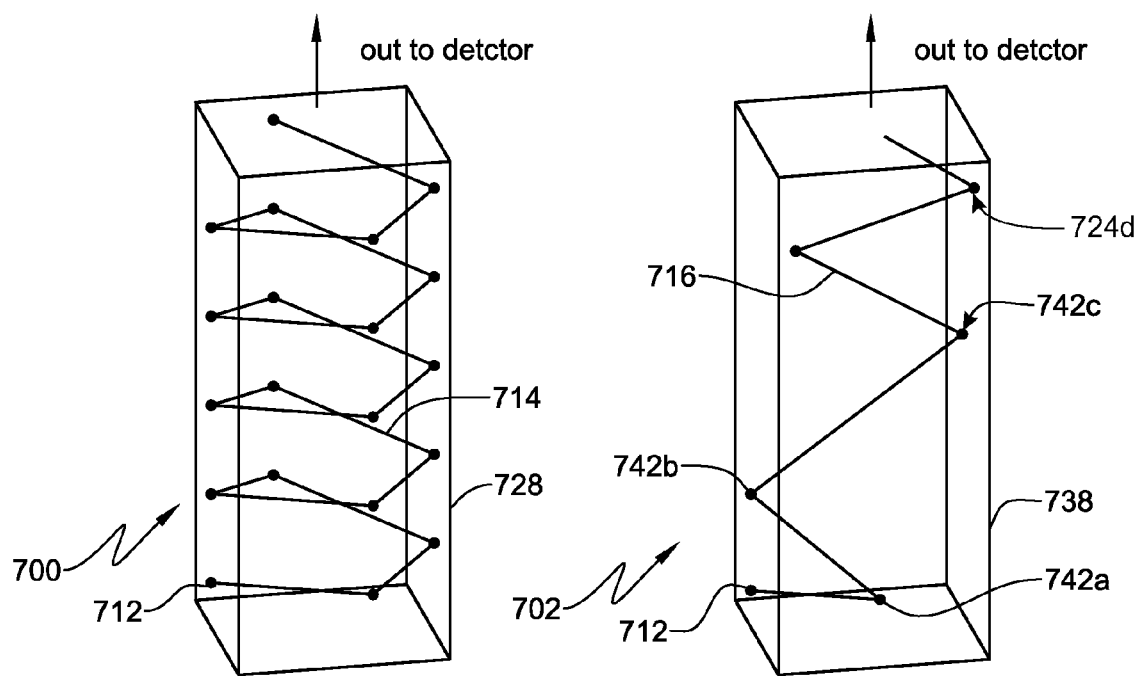
FIGS. 7A and 7B provide side views showing the pathway of a photon through a smooth walled scintillation pixel (7A) and through an embodiment of a scintillation pixel that includes vertically oriented ridges.

FIGS. 7A and 7B provide schematic illustrations of the pathway of a detectable photon through a pixel 700 having smooth polished sides 728 (7A) and a pixel 702 having side surfaces 738 that include longitudinal prism shaped ridges (7B). For clarity, the prism shaped ridges are not shown. Each of the scintillation pixels is surrounded by a diffuse reflector (not shown) such as polytetrafluoroethylene (PTFE). The pathway in each of FIGS. 7A and 7B starts at the same location 712 where the scintillation event occurs. However, the total path length 716 in FIG. 7B is significantly shorter than that in FIG. 7A, leading to faster detection of the scintillation event. This can improve timing between imaging points and increase coincidence timing. Positions 742a, 742b and 742c represent areas where the photon exits through a prism shaped ridge and interacts with the diffuse reflector resulting in a change in trajectory angle that is significantly different from that achieved in FIG. 7A with smooth polished sides and a substantially planar diffuse reflector.

After a scintillation event, detectable light can be emitted from a scintillation pixel in a shorter time span than when compared to the same pixel absent the ridges. For example, computer simulation shows that the inclusion of longitudinally oriented ridges in a 4×4×30 mm pixel of $LaBr_3$ can reduce the detectable light average emission path length, and thus the time of detection, by about 10%. Path length is also reduced in LYSO when longitudinal prism shaped ridges are used. Data are provided in Table 1 below and indicate that the inclusion of longitudinally oriented prism shaped ridges on the sides of the scintillation pixel can provide for a faster scintillator resulting in improved timing and, for example, reduced rise time jitter and better neutron coincidence in applications such as gamma ray cameras and associated particle imagers, respectively. Faster scintillator pixels can improve image quality in time-of-flight positron emission scanners (PET scanners) by reducing the coincidence resolving time, can improve gamma-neutron identification in pulse shape discrimination (PSD) detectors by reducing dispersion of the fast component of the scintillation pulse.

Table 1 also provides data regarding the average exiting angle of a detectable light photon exiting the pixel. Simulations were completed using the DETECT2000 optical simulation software. (C. Moisan et al., DETECT2000—A Program for Modeling Optical Properties of Scintillators, Department of Electrical and Computer Engineering, Laval University, Quebec City, 2000.) The simulation modeled pixels with dimensions 4×4×30 mm³. One 4×4 mm² face was the optical exit. The other five faces were layered with PTFE reflector. 100,000 photons were simulated in each pixel. Each photon was generated randomly within the volume of the pixel and initially given a random direction. Only those photons that exited the pixel were included as data in Table 1. The results indicate that a scintillation pixel of $LaBr_3(Ce)$ with a series of horizontally oriented equilateral prisms having dimensions of 80 □m pitch with 69 □m ridge height can narrow the average exiting angle of the photon from 51.3° to 38.6°. The effect of this reduction in exit angle is shown in FIGS. 8A and 8B. The grid shown in each of these figures represents a 64 anode PSPMT (Hamamatsu H8500). The pixel in the simulation was optically coupled to the PSPMT window with a 1 □m thickness of silicone oil. The PSPMT window was 2 mm thick with the photocathode surface of the window being opposite that of the pixel. Each of the smaller squares in the grid represents a single anode on the PSPMT. FIG. 8A shows modeled results from a $LaBr_3(Ce)$ pixel measuring 4×4×30 mm and including continuous horizontal prism shaped ridges along each side of the pixel. FIG. 8B shows modeled results from a pixel that is identical to that of FIG. 8A except that it lacks the horizontal ridges and has standard smooth polished sides. Both pixels were surrounded by a diffuse reflector (PTFE). The number associated with each anode is representative of the percentage of total light output from the pixel that falls on that particular anode. It is notable that a greater percentage of the light emitted from the pixel is concentrated in the center of the PSPMT of FIG. 8A when compared to that of FIG. 8B. More than 95% of the light emitted from the pixel in FIG. 8A is concentrated in the central 4 anode spaces while none (or negligible amounts) of the light hits the 28 anode locations around the perimeter of the PSPMT. This concentration of light and reduction in light spreading can result in several advantages including providing for more precise positioning of the pixel for greater spatial resolution. This is facilitated by the increase in the amount of light that impacts the anodes that are used for positioning while less light is lost to anodes that are not useful for positioning the pixel.

TABLE 1

| Geometry | Scintillator Material | Avg. Photon Path length (ns) | Avg. Exiting Angle ° |
|---|---|---|---|
| Polished Planar | $LaBr_3(Ce)$ ($n_i = 1.92$) | 2.0 | 51.3 |
| Horizontal prisms | $LaBr_3(Ce)$ | 3.0 | 38.6 |
| Vertical prisms | $LaBr_3(Ce)$ | 1.8 | 49.7 |
| Polished Planar | LYSO ($n_i = 1.79$) | 1.8 | 49.0 |
| Horizontal prisms | LYSO | 2.9 | 37.6 |
| Vertical prisms | LYSO | 1.7 | 48.6 |

Figure 9:
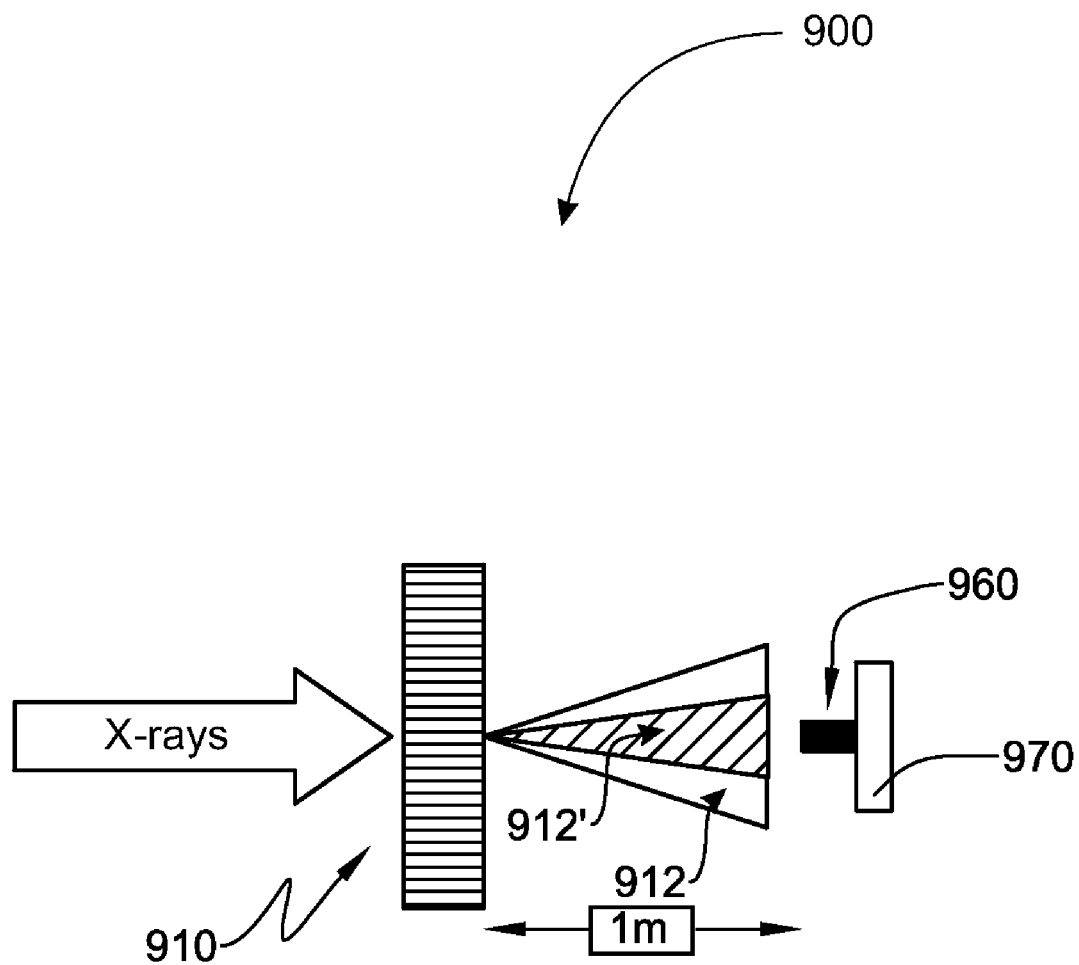
FIG. 9 provides a schematic diagram of one embodiment of a paraxial imaging system.

As illustrated schematically in FIG. 9, horizontally distributed prism shaped ridges (e.g., pyramids) may provide specific advantages when used with paraxial imaging systems. Scintillator array 910 may include an array of scintillator pixels arranged in a 10×10 grid with their high energy end in the direction of a high energy source. As shown, lens 960 is 2 inches (5.08 centimeters) in diameter and is placed 1 meter from array 910. Detector 970, in this case a CCD camera, can be a fast imaging device that combined with lens 960 forms a paraxial imaging system 900. Light cone 912 illustrates the light spread that occurs when the pixels that make up array 910 have continuous, flat, polished sides. In contrast, light cone 912' illustrates the narrower cone that is achieved when the scintillation pixels include prism shaped ridges arranged in a horizontal pattern on the sides of the pixels. This narrower light cone results in 2.5× more light collected by lens 960 when compared to pixels that do not have the ridges.

Figure 10:
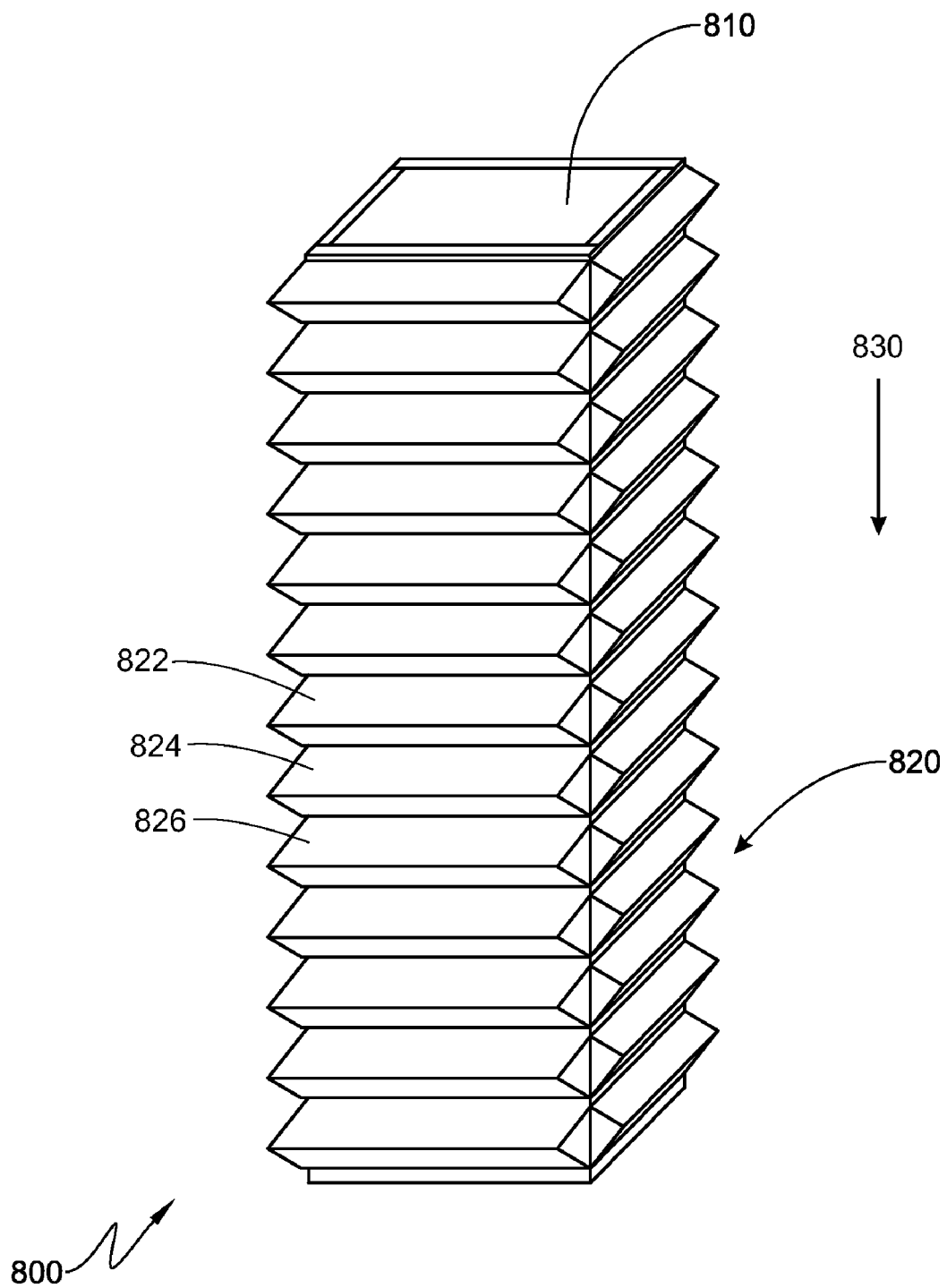
FIG. 10 provides a plan view of an embodiment of a scintillation pixel that includes a micro-prism film coupled to the pixel faces.
Figure 11:
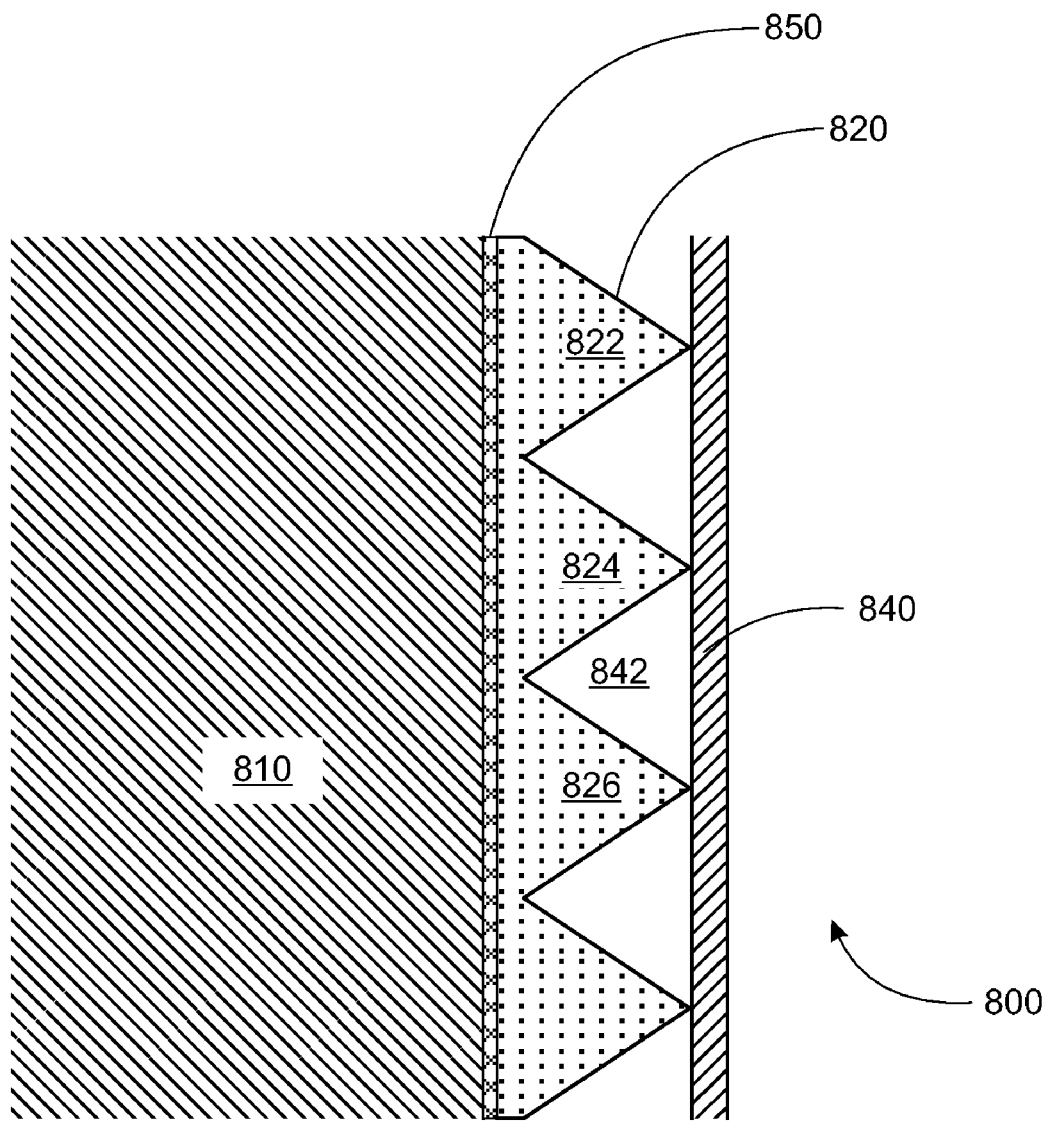
FIG. 11 provides an enlarged cross sectional view of a portion of the embodiment shown in FIG. 10.

FIG. 10 provides a plan view of an embodiment of a scintillation pixel 800 that includes a ridged micro-prism film 820. FIG. 11 provides an enlarged cross section view of a portion of the embodiment shown in FIG. 10 and includes reflective material 840. Arrow 830 indicates the axis of propagation through the scintillator. Film 820 may be a thin, planar material formed from a sheet or, in other embodiments, can be, for example, a surface of a thicker material. As shown, film 820 includes angled pyramid portions 822, 824 and 826 and can be affixed to scintillator element 810 via adhesive layer 850. Adhesive layer 850 may have a refractive index of greater than 1.0. Film 820 can be transparent (greater than 90% transmission of incident light), or substantially transparent (greater than 50% transmission of incident light) to detectable light. In one embodiment the material for the film 820 is Vikuiti™ TRAF. Scintillator element 810 may be of any appropriate composition and typically has smooth, planar sides that are void of ridges (although in some embodiments both the scintillator element and the film may include ridges). As with many other embodiments, the sides of pixel 800 (including film 820) can be surrounded by a diffuse or specular reflective material 840 such as PTFE. The reflective material may be integral to, or separate from film 820. As shown, film 820 is in a pyramid structure in which ridge peaks extend away from the surface of the scintillator element and ridge valleys extend toward the surface of the scintillator element. As with the ridges illustrated in other embodiments, the ridges in FIG. 10 are greatly enlarged with respect to the scintillator element. The ridges may have a height (from valley to peak) of greater than 1 μm, greater than 10 μm, greater than 100 μm or greater than 1 mm. When a photon of detectable light exits the scintillator element it can be reflected by the change in index of refraction that exists between film 820 and the gap 842 that exists between the film and reflective material. In some cases, the photon can be reflected back into the scintillator element at an angle different from that which would be realized in the absence of film 820. This angle of reflection may be expanded, causing any subsequent interaction of the photon to be closer to the detector than would occur in a standard smooth polished scintillator surrounded by a smooth, planar reflective material. For example, see the pathway illustrated in FIG. 6B. The resultant spread of the emitted detectable light can be reduced while increasing the concentration of light in the central portion of an associated photodetector. If the ridges instead are positioned vertically and are formed perpendicular to those that are shown in FIG. 10, the time for an average photon to exit the scintillator can be reduced. In this manner, faster scintillators can be produced using smooth walled scintillator elements.

While several embodiments of the present invention have been described and illustrated herein, those of ordinary skill in the art will readily envision a variety of other means and/or structures for performing the functions and/or obtaining the results and/or one or more of the advantages described herein, and each of such variations and/or modifications is deemed to be within the scope of the present invention. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings of the present invention is/are used. Those skilled in the art will recognize, or be able to ascertain using no more than routine experimentation, many equivalents to the specific embodiments of the invention described herein. It is, therefore, to be understood that the foregoing embodiments are presented by way of example only and that, within the scope of the appended claims and equivalents thereto, the invention may be practiced otherwise than as specifically described and claimed. The present invention is directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the scope of the present invention.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Other elements may optionally be present other than the elements specifically identified by the "and/or" clause, whether related or unrelated to those elements specifically identified, unless clearly indicated to the contrary.

All references, patents and patent applications and publications that are cited or referred to in this application are incorporated in their entirety herein by reference.

What is claimed is:

1. A scintillation pixel comprising:
   a scintillator element having at least one side, a high energy end and an opposed light emitting end; and
   wherein the at least one side of the scintillator element is substantially parallel to the axis of light propagation and defines a plurality of ridges each having a height of at least 1 μm.

2. The scintillation pixel of claim 1 wherein the ridges are substantially longitudinal in relation to the axis of light propagation of the pixel.

3. The scintillation pixel of claim 1 wherein the ridges are substantially horizontal in relation to the axis of light propagation of the pixel.

4. The scintillation pixel of claim 1 wherein the ridges have a height of greater than 10 μm.

5. The scintillation pixel of claim 1 wherein the pixel includes four sides and each side includes a plurality of ridges.

6. The scintillation pixel of claim 1 wherein the ridges have a height of at least 10 μm.

7. The scintillation pixel of claim 1 wherein the ridges are parallel to each other.

8. The scintillation pixel of claim 1 wherein the scintillator element is comprised of a scintillation material selected from crystal, ceramic and polymer.

9. A scintillation array comprising a plurality of pixels of claim 1.

10. An imaging device comprising the scintillation pixel of claim 1.

11. A scintillation pixel comprising;
    a scintillator element having at least one side, a high energy end and an opposed light emitting end, wherein the at least one side of the scintillator element is substantially parallel to an axis of propagation; and
    a substantially transparent film adjacent the scintillator element, the substantially transparent film having a proximal surface affixed to the at least one side surface of the scintillator element and an exterior surface facing away from the scintillator element, wherein the exterior surface of the substantially transparent film includes a plurality of portions having surfaces that are non-parallel to the axis of propagation of the scintillator element.

12. The scintillation pixel of claim 11 wherein the film is a micro-prism film.

13. The scintillation pixel of claim 11 wherein the film is surrounded by a diffuse reflector.

14. The scintillation pixel of claim 13 comprising a series of gaps between the film and the diffuse reflector.

15. The scintillation pixel of claim 11 wherein the film is a rigid film optically coupled to the scintillation element with a transparent material with a refractive index greater than 1.0.

16. A method of fabricating a scintillation pixel, the method comprising:
    forming a series of ridges on a side of a scintillator element, the side being substantially parallel to the axis of light propagation of the scintillator element; and
    affixing a substantially reflective material to the side of the scintillator element.

17. The method of claim 16 wherein the ridges have a height of at least 10 μm.

18. The method of claim 16 wherein forming comprises machining the ridges into the scintillator.

19. The method of claim 16 wherein forming comprises molding the ridges into the scintillator.

20. The method of claim 16 comprising joining a plurality of the scintillation pixels into an array.

* * * * *